United States Patent

Stefani et al.

[11] Patent Number: 4,717,887
[45] Date of Patent: Jan. 5, 1988

[54] DIFFERENTIAL AMPLIFIER STAGE HAVING CIRCUIT ELEMENTS FOR SETTING THE GAIN TO ZERO

[75] Inventors: Fabrizio Stefani, Cardano Al Campo; Edoardo Botti, Mortara, both of Italy

[73] Assignee: SGS Microelettronica SpA, Agrate Brianza, Italy

[21] Appl. No.: 916,737

[22] Filed: Oct. 8, 1986

[51] Int. Cl.[4] .............................................. H03F 3/45
[52] U.S. Cl. ..................................... 330/261; 330/254
[58] Field of Search ................ 330/252, 254, 261, 278

[56] References Cited

U.S. PATENT DOCUMENTS 4,575,687  3/1986  Moore, Jr. ........................... 330/261

Primary Examiner—Gene Wan
Attorney, Agent, or Firm—Wenderoth, Lind & Ponack

[57] ABSTRACT

Differential amplifier stage, having circuit elements for setting the gain to zero, includes a first transistor and a second transistor, whose bases are respectively connected to the positive terminal of a voltage source by a first current generator and a second current generator and are also respectively connected to the emitters of a third and a fourth transistor via a first and a second diode. The emitters of the first and second transistors are both coupled to the negative terminal of the voltage source by means of a third current generator. The collectors of the third and fourth transistors are connected to the negative terminal of the voltage source. The base terminals of the third and fourth transistors respectively form first and second input terminals. On the other hand, the collector terminals of the first and second transistors form first and second output terminals. The differential amplifier stage includes a fifth transistor whose collector is respectively connected to the bases of the first and second transistors via a third and a fourth diode, and whose emitter is connected to the negative terminal of the voltage source. The base terminal of this fifth transistor forms an inhibit terminal for setting the gain of the amplifier stage to zero.

8 Claims, 1 Drawing Figure

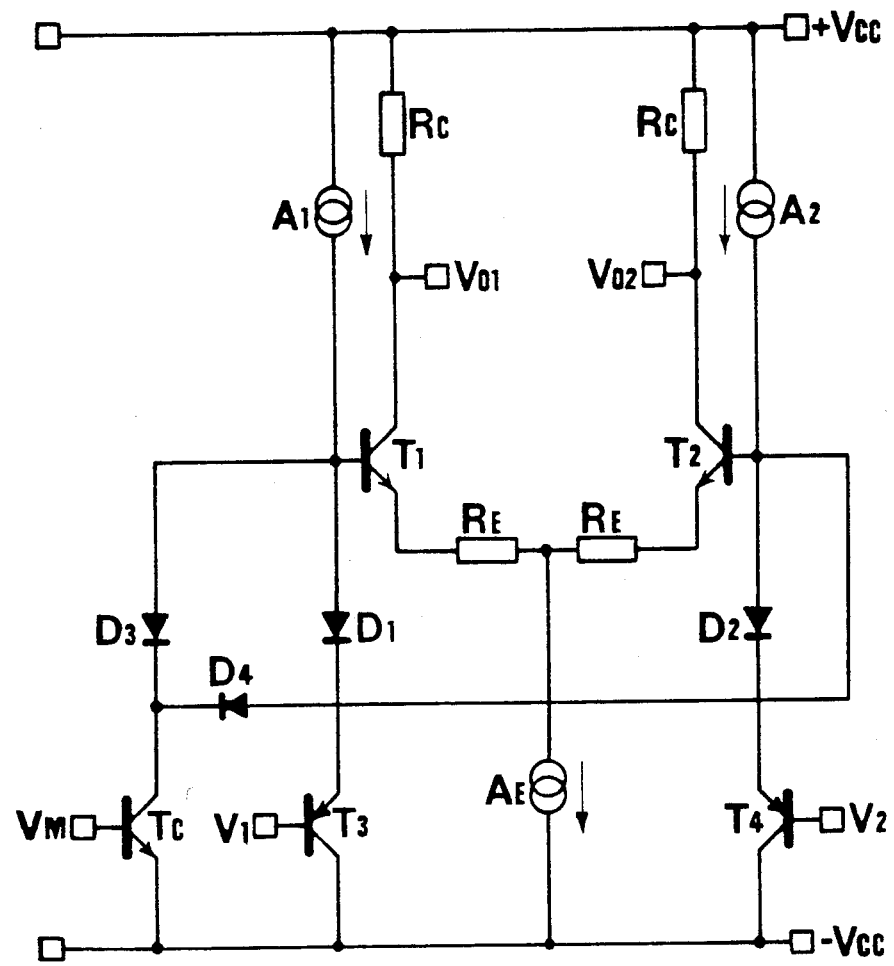

DIFFERENTIAL AMPLIFIER STAGE HAVING CIRCUIT ELEMENTS FOR SETTING THE GAIN TO ZERO

BACKGROUND OF THE INVENTION

The present invention relates to a differential amplifier stage comprising circuit elements for setting the gain to zero and which can be used in amplifier circuits for audio-frequency signals.

Amplifier circuits have at least one input terminal to which is applied à signal of an audio-frequency current or voltage, and at least one output terminal to which is usually connected a loudspeaker, which converts the electrical signal into an acoustic signal.

These amplifier circuits may also include an inhibit terminal with which it is possible to inhibit the amplification, thereby interrupting the production of acoustic signals. When this interruption occurs, transient electrical signals are inevitably produced, which are indistinguishable, for amplification purposes, from the signals applied to the input terminal.

If the spectrum of frequencies of transient signals contains harmonics in the audible range, the loudspeaker converts them into an unwanted, spurious acoustic interference.

The elimination of these transients, or at least the reduction of their harmonic contents is clearly a prerequisite in any circuit operation for carrying out the inhibiting function.

Another prerequisite is that the two enabling and disabling transients for this interruption be as symmetrical as possible in time.

With respect to these prerequisites, a circuit solution of the prior art consists of an amplifier circuit comprising, in addition to the usual signal input terminals, another input terminal, to which a zero signal is applied constantly.

Thus, the inhibit terminal serves to switch the amplifier circuit from the usual input terminals to said other terminal with zero signal with subsequent inhibiting of the acoustic signal.

This solution provides good results in terms of control speed and reduction of the spurious transient signals, but it is not universally applicable precisely because it requires an additional input terminal. In fact, in a monolithically integrated circuit, the number of terminals is fixed by the container selected.

Moreover, there are usually numerous circuit elements that carry out the switching described above, which, at times, necessitates the entire splitting of the input stage of the amplifier circuit.

SUMMARY OF THE INVENTION

The object of this invention is to design a differential amplifier stage for amplifier circuits for audio-frequency signals that can be integrated monolithically, wherein it is possible to very quickly inhibit the amplification of the signal without introducing spurious audible transients, and that is also distinguished by low circuit complexity.

This object is achieved by providing a differential amplifier stage, having a first input terminal and a second input terminal and a first output terminal and a second output terminal and an inhibit terminal, comprising:

a voltage source having first and second terminals;

a first transistor and a second transistor, both having a first terminal, a second terminal, and a control terminal, and having the same type of conductivity, said control terminal of said first transistor and said control terminal of said second transistor being respectively coupled to said first terminal of said voltage source by means of a first current generator and a second current generator, said first terminals of said transistors both being coupled to said second terminal of said voltage supply generator by means of at least one third current generator, said second terminal of said first transistor and said second terminal of said second transistor respectively forming said first output terminal and said second output terminal, said control terminal of said first transistor and said control terminal of said second transistor being respectively coupled to said first input terminal and to said second input terminal by means of a first biasing circuit and a second biasing circuit, wherein the control terminals of said first and second transistors are both connected to a third biasing circuit, which is activated by means of a signal applied to said inhibit terminal, said third biasing circuit being imposing between said control terminals of said first and second transistors a potential difference equal to that prevailing between said control terminals where the difference between potential values respectively applied to said first input terminal and said second input terminal is zero when activated by said signal applied to said inhibit terminal.

BRIEF DESCRIPTION OF THE DRAWING

The invention will be better understood by the following detailed description given solely by way of non-limitative example by reference to the accompanying drawing, in which the one and only figure is the circuit diagram of one practical embodiment of an amplifier stage incorporating the invention.

DESCRIPTION OF THE PREFERRED EMBODIMENTS

The diagram of the differential amplifier stage of the invention illustrated in the figure comprises a pair of bipolar NPN transients denoted by the symbols T1 and T2.

The base of transistor T1 and the base of transistor T2 are respectively connected to the positive terminal (+Vcc) of a voltage source via a first current generator denoted by the symbol A1, and a second current generator labeled A2. The emitters of transistors T1 and T2 are both connected via two resistors RE of equal value to a first terminal of a third current generator AG, whose second terminal is connected to the negative terminal (−Vcc) of the voltage source.

The base of transistor T1 is connected to the anode of a first diode D1, whose cathode is connected to the emitter of a bipolar PNP transistor T3.

On the other hand, the base of transistor T2 is connected to the anode of a second diode D2, whose cathode is connected to the emitter of a bipolar PNP transistor T4 the same type as T3. The collectors of transistor T3 and T4 are connected to −Vcc.

The base terminal of transistor T3 labeled V1 and the base terminal of transistor T4 marked V2 respectively form a first and a second signal input terminal of the amplifier stage.

The collector terminals of transistors T1 and T2 denoted, respectively, V01 and V02, are both connected to Vcc via two resistors Tc of equal value. These collector terminals of transistor T1 and T2 respectively form a first output terminal and a second output terminal of the stage.

According to the present invention, the bases of transistors T1 and T2 are also respectively connected to the anodes of a third diode D3 and a fourth diode D4. The cathodes of diodes D3 and D4 are both connected to the collector of a bipolar NPN transistor Tc, whose emitter is connected to −Vcc.

The base terminal of this transistor Tc labeled VM forms an inhibit terminal of the amplifier stage.

The functioning of the circuit depicted in the figure will now be discussed.

Transistors T1 and T2 together form a differential structure, and in the stage in which transistor Tc is turned off, the potential difference between the bases of transistors T1 and T2 is amplified by a factor determined by the values of the resistors Rc and RE. Between terminals V01 and V02 it is possible to sample an output signal equal to said amplifier potential difference.

Transistor T3, in series with diode D1, absorbs a portion of the current from generator A1 and biases the base of transistor T1. Similarly, transistor T3, in series with diode D2, absorbs a portion of the current from generator A1 and biases the base of transistor T2.

Thus, the potential difference between the bases of transistors T1 and T2 is function of the potential difference between input terminals V1 and V2.

Generators A1 and A2, diodes D1 and D2, and transistors T3 and T4 are equal to each other: the output signal is zero if the input terminals are at the same potential. Let us now examine the state in which transistor Tc is turned on via the inhibit terminal VM.

The biasing conditions described above cannot continue to exist, since the current from generator A1 is absorbed by transistor Tc via diode D3; the current from generator A2 is also absorbed by transistor Tc via diode D4.

If diodes D3 and D4 are equal to each other, due to the obvious symmetry, the bases of transistors T1 and T2 are at the same potential, exactly as in the case in which input terminal V1 and V2 are equipotential.

Put differently, transistor Tc and diodes D3 and D4 set the gain of the differential structure formed by transistors T1 and T2 to zero without turning them off, but forcing them into a state equal to that which is due them when the input is zero.

By avoiding the turn-off of transistors T1 and T2, the object of not producing spurious transients when transistor IC comes into operation is achieved.

Furthermore, the speed of this operation is very high, since it depends solely on the switching times of transistor IC, which are easily rendered symmetrical in time.

According to the present invention, a differential amplifier stage comprising the circuit elements for setting the gain to zero is apt to be integrated into a monolithic block of semiconductor by means of prior art integration techniques.

While only one embodiment of the invention has been illustrated and described, it goes without saying that many modifications are possible without departing from the scope of the invention. For example, diodes D1 and D2 may also be Zener diodes; they can also be replaced by circuit elements that are also capable of generating a predetermined voltage at their terminals.

Instead of being connected to the negative terminal −Vcc by means of a single current generator AE, each of the emitters of transistor T1 and T2 can also be connected to this negative terminal by means of a current generator, while at the same time being connected via a resistor.

We claim:

1. A differential amplifier stage, having a first input terminal and a second input terminal and a first output terminal and a second output terminal and an inhibit terminal, comprising:

a voltage source having first and second terminals;

a first transistor and a second transistor, both having a first terminal, a second terminal, and a control terminal, and having the same type of conductivity, said control terminal of said first transistor and said control terminal of said second transistor being respectively coupled to said first terminal of said voltage source by means of a first current generator and a second current generator, said first terminals of said transistors both being coupled to said second terminal of said voltage supply generator by means of at least one third current generator, said second terminal of said first transistor and said second terminal of said second transistor respectively forming said first output terminal and said second output terminal, said control terminal of said first transistor and said control terminal of said second transistor being respectively soupled to said first input terminal and to said second terminal by means of a first biasing circuit and a second biasing circuit, wherein the control terminals of said first and second transistors are both connected to a third biasing circuit, which is activated by means of a signal applied to said inhibit terminal, said third biasing circuit being imposing between said control terminals of said first and second transistors a potential difference equal to that prevailing between said control terminals where the difference between said control terminals where the difference between potential values respectively applied to said first input terminal and said second input terminal is zero when activated by said signal applied to said inhibit terminal.

2. A differential amplifier stage as set forth in claim 1, wherein said first biasing circuit comprises a third transistor and a first diode, and second diode, said third transistor and fourth transistor each having a first, a second terminal and a control terminal and both having a type of conductivity opposite to that of said first and second transistors, said first terminal of said third transistor and said first terminal of said fourth transistor being respectively connected to said control terminal of said first transistor via said first diode and to said control terminal of said transistor via said second diode, said second terminals of said third and fourth transistors being connected to said second terminal of said voltage source, said control terminal of said third transistor and said control terminal of said fourth transistor being, respectively, said first input terminal and said second input terminal.

3. A differential amplifier stage as set forth in claim 1, wherein said third biasing circuit element comprises another transistor having a first terminal, a second terminal, and a control terminal, one of said first and second terminal being connected to said second terminal of said voltage source, the other of said first and second terminals being respectively connected to said control terminal of said first transistor and to said control terminal of said second transistor via two diodes, said control terminal being said inhibit terminal.

4. A differential amplifier stage as set forth in claim 2, wherein said third biasing circuit element comprises another transistor having a first terminal, a second terminal, and a control terminal, one of said first and second terminal being connected to said second terminal of said voltage source, the other of said first and second terminals being respectively connected to said control terminal of said first transistor and to said control terminal of said second transistor via two diodes, said control terminal being said inhibit terminal.

5. A differential amplifier stage as set forth in claim 1, wherein all of said transistors are bipolar transistor, and said first terminal, control terminal, and second terminal of each of them being, respectively, an emitter, base, and collector.

6. A differential amplifier stage as set forth in claim 2, wherein all of said transistors are bipolar transistor, and said first terminal, control terminal, and second terminal of each of them being, respectively, an emitter, base, and collector.

7. A differential amplifier stage as set forth in claim 3, wherein all of said transistors are bipolar transistor, and said first terminal, control terminal, and second terminal of each of them being, respectively, an emitter, base, and collector.

8. A differential amplifier stage as set forth in claim 4, wherein all of said transistors are bipolar transistor, and said first terminal, control terminal, and second terminal of each of them being, respectively, an emitter, base, and collector.

* * * * *